US010217454B2

(12) United States Patent
Hirano et al.

(10) Patent No.: US 10,217,454 B2
(45) Date of Patent: Feb. 26, 2019

(54) VOICE SYNTHESIZER, VOICE SYNTHESIS METHOD, AND COMPUTER PROGRAM PRODUCT

(71) Applicants: KABUSHIKI KAISHA TOSHIBA, Minato-ku, Tokyo (JP); TOSHIBA SOLUTIONS CORPORATION, Kawasaki-shi, Kanagawa (JP)

(72) Inventors: Kaoru Hirano, Tokyo (JP); Masaru Suzuki, Kanagawa (JP); Hiroyuki Mizutani, Kanagawa (JP)

(73) Assignees: KABUSHIKI KAISHA TOSHIBA, Tokyo (JP); TOSHIBA SOLUTIONS CORPORATION, Kawasaki-shi (JP)

( * ) Notice: Subject to any disclaimer, the term of this patent is extended or adjusted under 35 U.S.C. 154(b) by 42 days.

(21) Appl. No.: 15/266,065

(22) Filed: Sep. 15, 2016

(65) Prior Publication Data

US 2017/0004821 A1 Jan. 5, 2017

Related U.S. Application Data

(63) Continuation of application No. PCT/JP2015/075638, filed on Sep. 9, 2015.

(30) Foreign Application Priority Data

Oct. 30, 2014 (JP) ................................ 2014-221770

(51) Int. Cl.
*G10L 13/00* (2006.01)
*G10L 13/10* (2013.01)
(Continued)

(52) U.S. Cl.
CPC ............ *G10L 13/10* (2013.01); *G10L 13/033* (2013.01); *G10L 13/0335* (2013.01); *G10L 13/04* (2013.01)

(58) Field of Classification Search
None
See application file for complete search history.

(56) References Cited

U.S. PATENT DOCUMENTS 6,928,408 B1 * 8/2005 Matsumoto ............. G10L 13/06 704/221
7,487,093 B2 2/2009 Mutsuno et al.
(Continued)

FOREIGN PATENT DOCUMENTS

JP 9-160583 6/1997
JP 2002-268664 9/2002
(Continued)

OTHER PUBLICATIONS

International Search Report for International Patent Application No. PCT/JP2015/075638 dated Dec. 8, 2015, 6 pages.
(Continued)

*Primary Examiner* — Douglas Godbold
(74) *Attorney, Agent, or Firm* — Amin, Turocy & Watson LLP

(57) ABSTRACT

According to an embodiment, a voice synthesizer includes a content selection unit, a content generation unit, and a content registration unit. The content selection unit determines selected content among a plurality of pieces of content registered in a content storage unit. The content includes tagged text in which tag information for controlling voice synthesis is added to text serving as a target of the voice synthesis. The content generation unit applies the tag information in the tagged text included in the selected content to designated text to generate new content. The content registration unit registers the generated new content in the content storage unit.

11 Claims, 16 Drawing Sheets

(51) Int. Cl.
*G10L 13/033* (2013.01)
*G10L 13/04* (2013.01)

(56) References Cited

U.S. PATENT DOCUMENTS

| | | | | |
|---|---|---|---|---|
| 7,630,898 | B1 * | 12/2009 | Davis | G06F 17/2735 704/260 |
| 8,086,456 | B2 * | 12/2011 | Beutnagel | G10L 13/07 704/258 |
| 2002/0052733 | A1 * | 5/2002 | Michizuki | G10L 13/07 704/207 |
| 2005/0027532 | A1 * | 2/2005 | Okutani | G10L 13/04 704/260 |
| 2005/0197839 | A1 * | 9/2005 | Chung | G10L 13/06 704/260 |
| 2006/0287861 | A1 * | 12/2006 | Fischer | G10L 13/06 704/260 |
| 2012/0072223 | A1 * | 3/2012 | Rosen | G10L 13/033 704/258 |
| 2013/0080175 | A1 | 3/2013 | Mori et al. | |
| 2015/0128026 | A1 | 5/2015 | Mori et al. | |
| 2015/0325248 | A1 * | 11/2015 | Conkie | G11C 7/16 704/207 |

FOREIGN PATENT DOCUMENTS

| | | |
|---|---|---|
| JP | 2003-295882 | 10/2003 |
| JP | 2004-325692 | 11/2004 |
| JP | 2007-233912 | 9/2007 |
| JP | 2009-186498 | 8/2009 |
| JP | 2012-252200 | 12/2012 |
| JP | 2013-073275 | 4/2013 |

OTHER PUBLICATIONS

Written Opinion for International Patent Application No. PCT/JP2015/075638 dated Dec. 8, 2015, 5 pages.

* cited by examiner

FIG.5

| | MALE | FEMALE | PLEASURE | SORROW | ANGER | ⋯ | WARMTH | PITCH | RATE |
|---|---|---|---|---|---|---|---|---|---|
| MAKER CONTENT M1 | 1 | 0 | 100 | 0 | 0 | ⋯ | 0 | 0 | 0 |
| MAKER CONTENT M2 | 1 | 0 | 0 | 100 | 0 | ⋯ | 0 | 10 | 0 |
| ⋮ | ⋮ | ⋮ | ⋮ | ⋮ | ⋮ | ⋯ | ⋮ | ⋮ | ⋮ |
| MAKER CONTENT Mk | 0 | 1 | 0 | 0 | 0 | ⋯ | 100 | 0 | 10 |
| CONTENT C1 | 1 | 0 | 30 | 0 | 0 | ⋯ | 0 | 5 | 1 |
| CONTENT C2 | 1 | 0 | 0 | 20 | 10 | ⋯ | 0 | 0 | 5 |
| ⋮ | ⋮ | ⋮ | ⋮ | ⋮ | ⋮ | ⋯ | ⋮ | ⋮ | ⋮ |
| CONTENT Cm | 0 | 1 | 0 | 0 | 0 | ⋯ | 10 | 5 | 0 |

VOICE SYNTHESIZER, VOICE SYNTHESIS METHOD, AND COMPUTER PROGRAM PRODUCT

CROSS-REFERENCE TO RELATED APPLICATIONS

This application is a continuation of PCT international application Ser. No. PCT/JP2015/075638 filed on Sep. 9, 2015, which designates the United States, and which claims the benefit of priority from Japanese Patent Application No. 2014-221770, filed on Oct. 30, 2014; the entire contents of which are incorporated herein by reference.

FIELD

Embodiments described herein relate generally to a voice synthesizer, a voice synthesis method, and a computer program product.

BACKGROUND

In a voice synthesis field, as effective methods for achieving desired synthesized voices including expressions such as various expressions of feelings, methods are known that produce voice waveforms of synthesized voices based on of tagged texts. The tagged text is composed of text serving as a target of voice synthesis and tag information described by a markup language and added to the text. The tag information is used for controlling voice synthesis of the text interposed with tags. A voice synthesis engine can obtain a desired synthesized voice by selecting a dictionary used for voice synthesis and adjusting a prosody parameter based on the tag information, for example.

A user can produce the tagged text by adding the tag information to text using an editor. This manner, however, requires the user to perform complicated work. It is, thus, common to produce the tagged text by applying a preliminarily produced template to the text serving as the target of voice synthesis.

The conventional common manner, however, requires enormous man-hours for preparation because a large number of templates need to be produced for various types of tag information. A technique is available that automatically produces templates by machine learning. This technique, however, needs to additionally prepare training data and correct answer data for the machine learning, thereby requiring complicated work. It is, thus, desired to establish a new mechanism for efficiently produce the tagged text.

BRIEF DESCRIPTION OF THE DRAWINGS

FIG. 5 is a schematic diagram conceptually illustrating exemplary content registered in a content storage unit;

DETAILED DESCRIPTION

According to an embodiment, a voice synthesizer includes a content selection unit, a content generation unit, and a content registration unit. The content selection unit determines selected content among a plurality of pieces of content registered in a content storage unit. The content includes tagged text in which tag information for controlling voice synthesis is added to text serving as a target of the voice synthesis. The content generation unit applies the tag information in the tagged text included in the selected content to designated text to generate new content. The content registration unit registers the generated new content in the content storage unit.

Embodiments will be described in detail below with reference to the accompanying drawings. A voice synthesizer according to each of the embodiments performs voice synthesis based on tagged text in which tag information is added to text serving as the target of the voice synthesis, and particularly has a mechanism that efficiently generates the tagged text. A combination of the tagged text and a voice waveform of a synthesized voice generated based on the tagged text is called a piece of "content" hereinafter. The content may include other information such as identification information about a voice synthesis dictionary used for voice synthesis besides the tagged text and the voice waveform of the synthesized voice. Any known method is adoptable for voice synthesis. Examples of the known method include phoneme based voice synthesis and voice synthesis using a hidden Markov model (HMM). The detailed descriptions thereof are omitted.

First Embodiment

Figure 1:
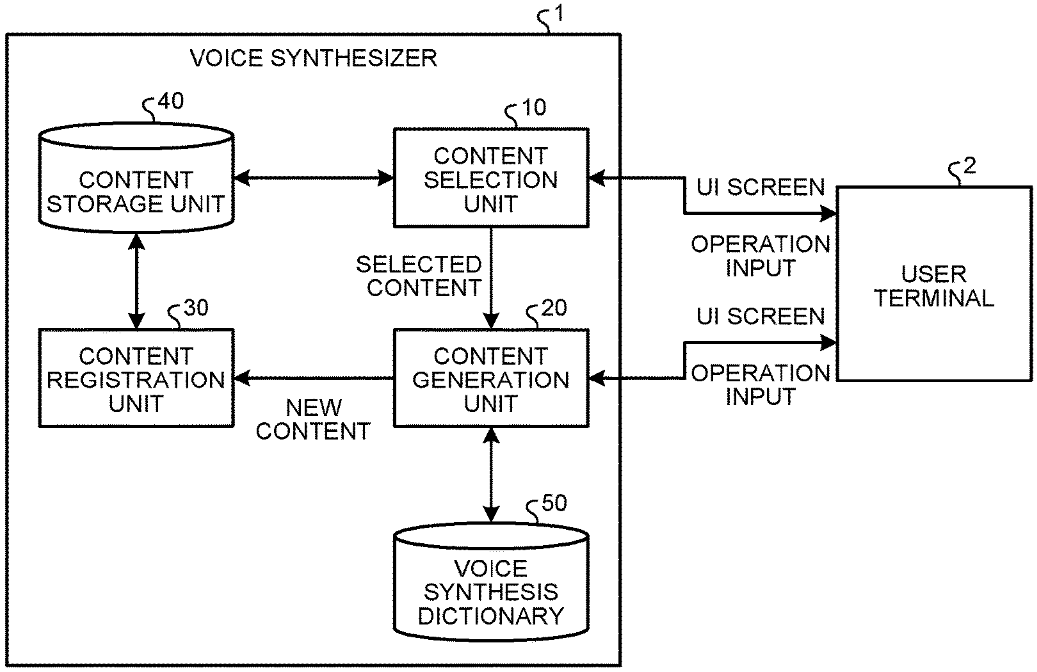
FIG. 1 is a block diagram illustrating an overall structure of a voice synthesizer in a first embodiment.

FIG. 1 is a block diagram illustrating an overall structure of a voice synthesizer 1 according to a first embodiment. The voice synthesizer 1 in the first embodiment can be achieved as a server on a network that provides web-based services to a user terminal 2 connected to the network as a client, for example. The user terminal 2 is information equipment used by a user, such as a personal computer, a tablet terminal, or a smartphone. The user terminal 2 includes various resources constituting a computer system, such as a central processing unit (CPU) and a memory, hardware such as various input devices, and various types of software such as an operating system (OS) and a web browser.

The voice synthesizer 1 in the embodiment is not necessary structured as a single apparatus. The voice synthesizer 1 may be structured as a system including a plurality of linked apparatuses. The voice synthesizer 1 may be achieved as a virtual machine that operates in a cloud computing system.

As illustrated in FIG. 1, the voice synthesizer 1 includes a content selection unit 10, a content generation unit 20, a content registration unit 30, a content storage unit 40, and a voice synthesis dictionary 50.

The content selection unit 10 causes the user terminal 2 to display a user interface (UI) screen, receives operation input performed by the user while using the UI screen, and determines selected content based on the user's operation among a plurality of pieces of content registered in the content storage unit 40. The selected content is the content selected from among the pieces of content in accordance with the user's operation.

The content generation unit 20 causes the user terminal 2 to display the UI screen, receives operation input performed by the user while using the UI screen, and applies the tag information in the tagged text included in the selected content determined by the content selection unit 10 to text designated by the user to generate new content.

The content registration unit 30 registers the new content generated by the content generation unit 20 in the content storage unit 40.

The content storage unit 40 stores therein marker content serving as a marker and the content generated by the content generation unit 20. The marker content, which emphasizes a specific feature, is preliminarily registered in the content storage unit 40. The content registration unit 30 registers the content generated by the content generation unit 20 in the content storage unit 40 in association with the marker content in accordance with a similarity with the marker content.

The content storage unit 40 may be provided outside the voice synthesizer 1. In this case, the content registration unit 30 accesses the content storage unit 40 outside the voice synthesizer 1 via a network and registers the content produced by the content generation unit 20 in the content storage unit 40, for example. The content selection unit 10 accesses the content storage unit 40 outside the voice synthesizer 1 via the network and acquires necessary content from the content storage unit 40 in accordance with the user's operation, for example.

The voice synthesis dictionary 50 is used when the content generation unit 20 generates a voice waveform of a synthesized voice based on the tagged text. The voice synthesis dictionary 50 is classified based on the features of the respective synthesized voices to be generated, for example. Based on the tag information in the tagged text, an optimum dictionary is selected. The voice synthesis dictionary 50 may be provided outside the voice synthesizer 1. In this case, the content generation unit 20 accesses the voice synthesis dictionary 50 outside the voice synthesizer 1 via the network and acquires necessary information from the voice synthesis dictionary 50, for example.

The following describes each unit included in the voice synthesizer 1 in the embodiment in detail.

Figure 2:
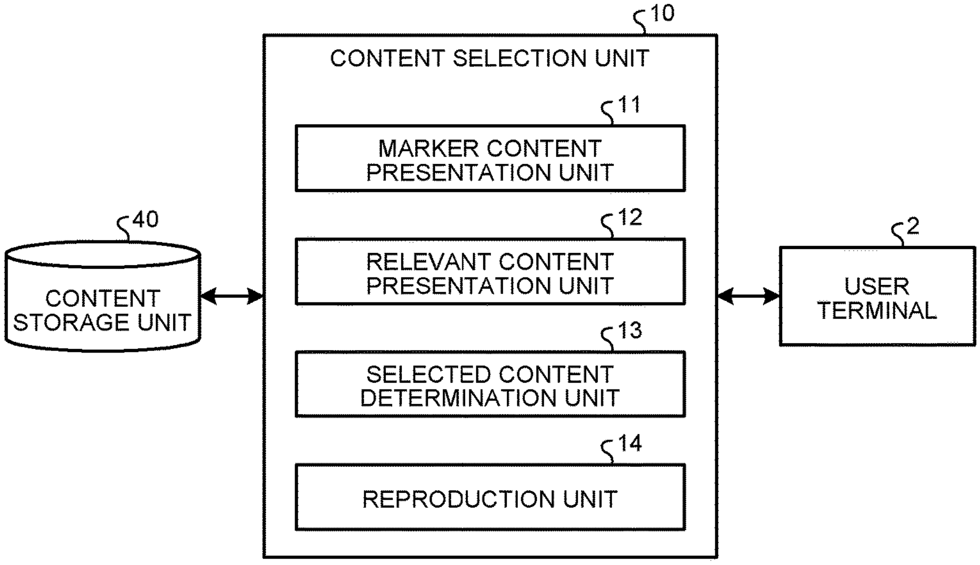
FIG. 2 is a block diagram illustrating an exemplary structure of a content selection unit.

FIG. 2 is a block diagram illustrating an exemplary structure of the content selection unit 10. As illustrated in FIG. 2, the content selection unit 10 includes a marker content presentation unit 11, a relevant content presentation unit 12, a selected content determination unit 13, and a reproduction unit 14.

The marker content presentation unit 11 presents a list of marker content registered in the content storage unit 40 to the user. The marker content presentation unit 11 generates a marker content list screen SC1 (refer to FIG. 8), which is described later, as the UI screen displayed by the user terminal 2, and causes the user terminal 2 to display the marker content list screen SC1, for example.

The relevant content presentation unit 12 presents, to the user, a list of relevant content associated with the marker content selected by the user from the list of marker content. The relevant content presentation unit 12 generates a relevant content list screen SC2 (refer to FIG. 9), which is described later, as the UI screen displayed by the user terminal 2, and causes the user terminal 2 to display the relevant content list screen SC2, for example.

The selected content determination unit 13 determines the relevant content selected from the list of relevant content to be the selected content. The selected content determination unit 13 determines the relevant content selected by the user from the relevant content list screen SC2 displayed on the user terminal 2 to be the selected content, for example.

The reproduction unit 14 reproduces the voice waveform of the synthesized voice included in the marker content or the voice waveform of the synthesized voice included in the relevant content in accordance with the user's operation, and causes the user terminal 2 to output the reproduced voice waveform as a voice from a speaker of the user terminal 2, for example. The reproduction unit 14 reproduces the voice waveform of the synthesized voice included in the marker content designated by the user from the marker content list screen SC1 displayed on the user terminal 2 or the voice waveform of the synthesized voice included in the relevant content designated by the user from the relevant content list screen SC2 displayed on the user terminal 2, and causes the user terminal 2 to output the reproduced voice waveform as a voice from a speaker of the user terminal 2, for example.

Figure 3:
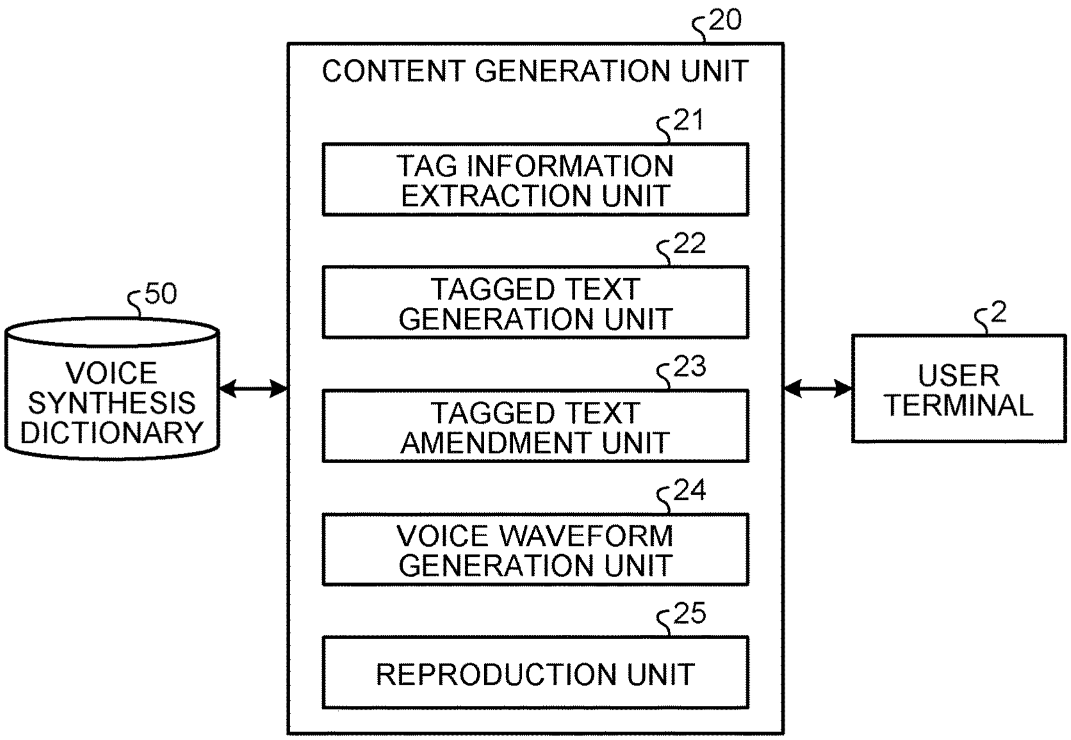
FIG. 3 is a block diagram illustrating an exemplary structure of a content generation unit.

FIG. 3 is a block diagram illustrating an exemplary structure of the content generation unit 20. As illustrated in FIG. 3, the content generation unit 20 includes a tag information extraction unit 21, a tagged text generation unit 22, a tagged text amendment unit 23, a voice waveform generation unit 24, and a reproduction unit 25.

The tag information extraction unit 21 extracts the tag information from the tagged text included in the selected content determined by the selected content determination unit 13. The tag information includes a start tag located forward in the text to which the tag information is applied and an end tag located backward in the text to which the tag information is applied. In the start tag and the end tag, an element name is described. In the start tag, an attribute value of the element represented by the element name is described. When the element includes a plurality of attributes, the respective attributes and the attribute values of the respective attributes are described in the start tag. Examples of the element included in the tag information include gender (attribute values are male and female), emotion (attribute values are pleasure, sorrow, anger, warmth, and the like), and prosody (attribute values are pitch of a voice, speaking speed, and the like).

For example, the tagged text included in the selected content determined by the selected content determination unit 13 is assumed as follows: <gender="female"><prosody pitch="+5%" rate="−2%">good morning</prosody></gender>. In this case, the tag information extraction unit 21 extracts the tag information in the tagged text as follows: <gender="female"><prosody pitch="+5%" rate="−2%"> </prosody></gender>. In the example, prosody is an element name that represents the prosody, pitch is the attribute value (attribute value is +5%) that represents the pitch of the voice in the element of prosody, and rate is the attribute value (attribute value is −2%) that represents the utterance speed in the element of prosody.

The tagged text generation unit 22 applies the tag information extracted by the tag information extraction unit 21 to text designated by the user to generate the tagged text. For example, the text designated by the user is assumed to be "hello" and the tag information described above is assumed to be extracted by the tag information extraction unit 21. In this case, the tagged text generation unit 22 generates the tagged text as follows: <gender="female"><prosody pitch="+5%" rate="−2%">hello</prosody></gender>.

The tagged text amendment unit 23 amends the tagged text generated by the tagged text generation unit 22 based on the user's operation. For example, the tagged text amendment unit 23 amends the attribute value (in the example, the values +5% or −2%) of the tag information included in the tagged text generated by the tagged text generation unit 22 based on the user's operation.

The voice waveform generation unit 24 generates the voice waveform of the synthesized voice corresponding to the tagged text generated by the tagged text generation unit 22 using the voice synthesis dictionary 50. When the tagged text amendment unit 23 amends the tagged text generated by the tagged text generation unit 22, the voice waveform generation unit 24 generates the voice waveform of the synthesized voice corresponding to the amended tagged text.

The reproduction unit 25 reproduces the voice waveform of the synthesized voice generated by the voice waveform generation unit 24, and causes the user terminal 2 to output the reproduced voice waveform as the voice from the speaker thereof, for example.

Figure 4:
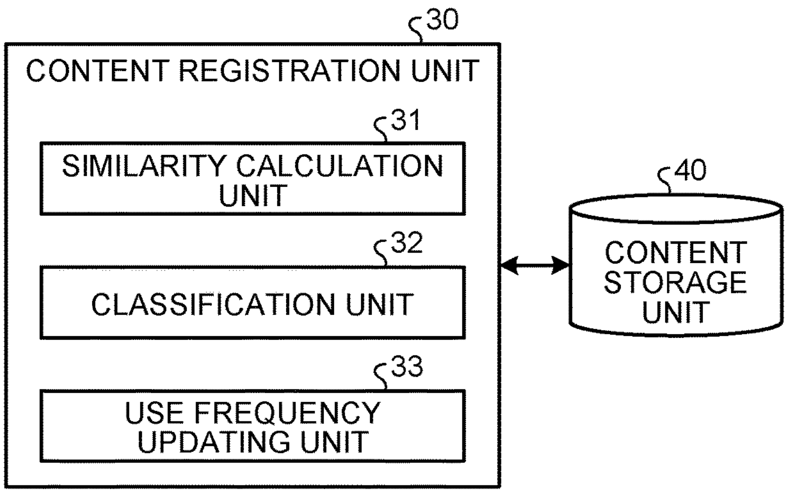
FIG. 4 is a block diagram illustrating an exemplary structure of a content registration unit.

FIG. 4 is a block diagram illustrating an exemplary structure of the content registration unit 30. As illustrated in FIG. 4, the content registration unit 30 includes a similarity calculation unit 31, a classification unit 32, and a use frequency updating unit 33.

The similarity calculation unit 31 calculates a similarity of the new content generated the content generation unit 20 with the marker content for registering the new content in the content storage unit 40 in association with the marker content.

As described above, the marker content, which emphasizes a specific feature, is preliminarily registered in the content storage unit 40. For example, the attribute value of the attribute representing emotion (e.g., pleasure, sorrow, anger, or warmth) is assumed to be capable of being set to a range from 0% to 100%, and the attribute value of each of the pitch of the voice and the speaking speed (rate) is assumed to be capable of being set to a range from −10% to +10%. In this case, as exemplarily illustrated in FIG. 5, marker content M1, M2, . . . , Mk, each of which emphasizes a specific feature, are preliminarily registered in the content storage unit 40. FIG. 5 is a schematic diagram conceptually illustrating exemplary content registered in the content storage unit 40.

When the content generation unit 20 generates new content, the similarity calculation unit 31 calculates the similarity of the new content to each of the pieces of marker content preliminarily registered in the content storage unit 40. The similarity between two pieces of content ci and cj can be obtained by calculating an inter-content distance D (ci,cj) represented by expressions (1) and (2), for example.

$$D(ci,cj)=\sqrt{A} \tag{1}$$

$$A=\{\text{pleasure}(ci)-\text{pleasure}(cj)\}^2+\{\text{sorrow}(ci)-\text{sorrow}(cj)\}^2+\{\text{anger}(ci)-\text{anger}(cj)\}^2+\ldots+\{\text{warmth}(ci)-\text{warmth}(cj)\}^2+\{\text{pitch}(ci)-\text{pitch}(cj)\}^2+\{\text{rate}(ci)-\text{rate}(cj)\}^2 \tag{2}$$

With a decrease in the inter-content distance D (ci,cj) calculated using expressions (1) and (2), the two pieces of content ci and cj are more similar to each other. In this example, the two pieces of content having the same gender attribute value are used for calculating the distance therebetween. A member relating to the gender attribute value may be added to expression (2) so as to calculate the inter-content distance D (ci,cj) between the different genders.

The classification unit 32 classifies the content generated by the content generation unit 20 based on the similarity calculated by the similarity calculation unit 31. The classification is processing that registers the content generated by the content generation unit 20 in the content storage unit 40 in association with the marker content similar to the content (e.g., the marker content having an inter-content distance equal to or smaller than a certain threshold with respect to the content). When a plurality of pieces of marker content are present that are similar to the content generated by the content generation unit 20, the content registration unit 30 registers the content in the content storage unit 40 in association with each of the pieces of marker content. Every time the content generation unit 20 generates new content, the classification unit 32 classifies the generated new content. As a result, the pieces of content associated with the marker content are stored in the content storage unit 40 in the order of the similarity for each piece of marker content, for example.

Figure 6:
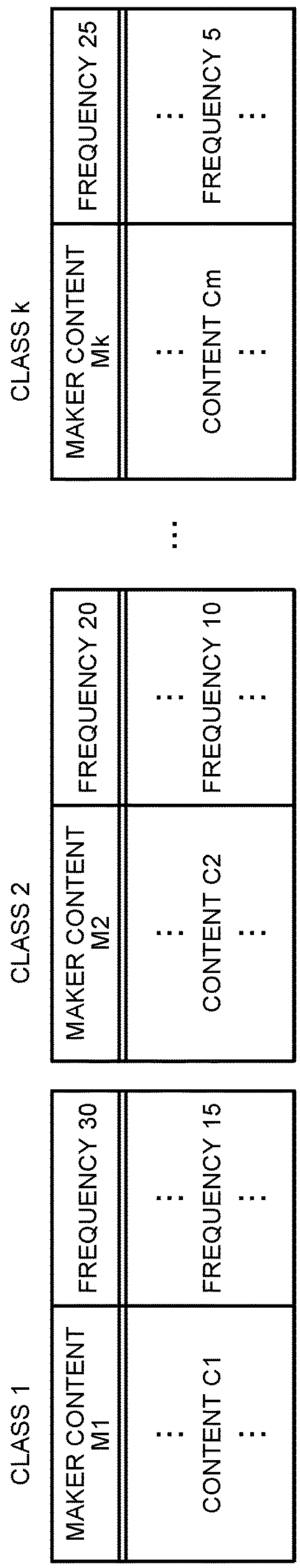
FIG. 6 is a schematic diagram to explain a storage form of the content in the content storage unit.

FIG. 6 is a schematic diagram explaining a storage form of the content in the content storage unit 40. As illustrated in FIG. 6, content C1, C2, . . . , Cm generated by the content generation unit 20 are stored in the content storage unit 40 in such a manner that the respective pieces of content C1, C2, . . . , Cm are classified into corresponding classes typified by respective pieces of marker content M1, M2, . . . , Mk. The content C1, C2, . . . , Cm are similar to the marker content M1, M2, . . . , Mk, respectively. Each piece of content is associated with information about the use frequency of the content. The use frequency represents the number of times the content is used as the selected content. Every time the content is used as the selected content by the content generation unit 20 for generating new content, the value of the use frequency of the content used as the selected content is incremented by one. The use frequency of the content serves as an index that presents whether the content is popular content to the user.

The use frequency updating unit 33 increments the value of the use frequency of the content used as the selected content for generating new content to update the use frequency when the new content generated by the content generation unit 20 is registered.

The following describes specific examples of the UI screen the voice synthesizer 1 in the embodiment causes the user terminal 2 to display with reference to FIGS. 7 to 11.

Figure 7:
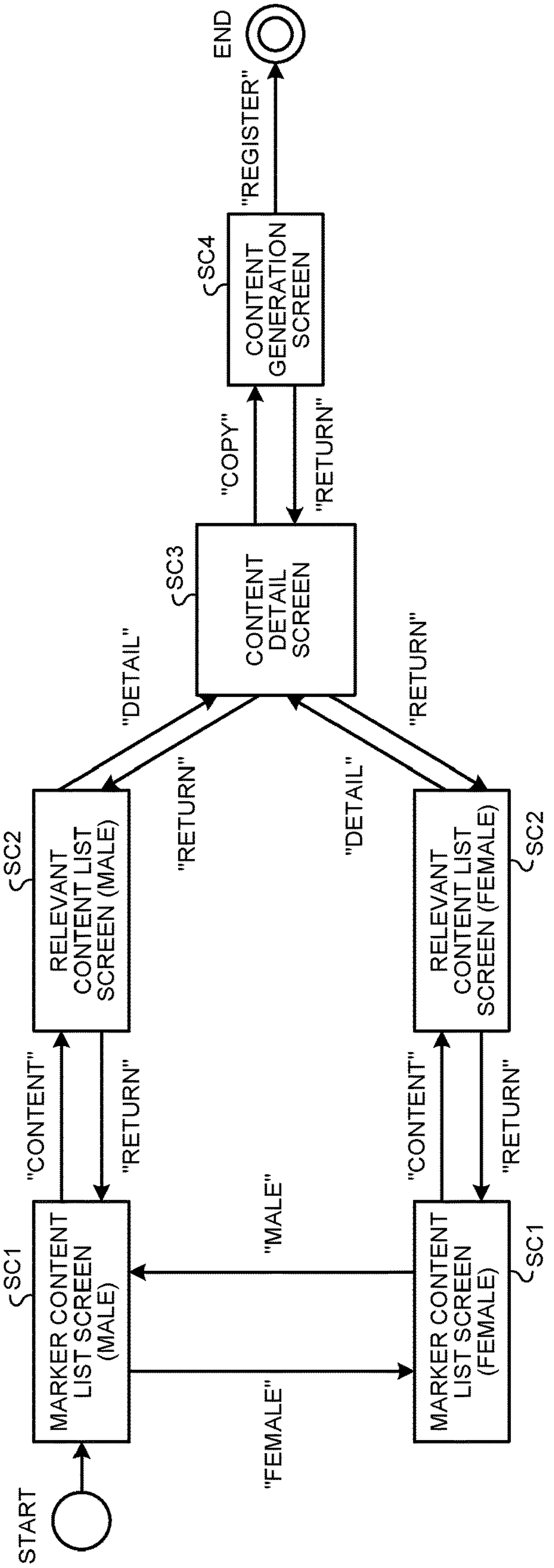
FIG. 7 is a schematic diagram to explain transition of screens in a user interface (UI) screen displayed on a user terminal.

FIG. 7 is a schematic diagram to explain transition of screens in the UI screen displayed on the user terminal 2. The voice synthesizer 1 in the embodiment causes the user terminal 2 to sequentially display, as the UI screen, the marker content list screen SC1, the relevant content list screen SC2, a content detail screen SC3, and a content generation screen SC4 in accordance with the screen transition illustrated in FIG. 7, for example.

Figure 8:
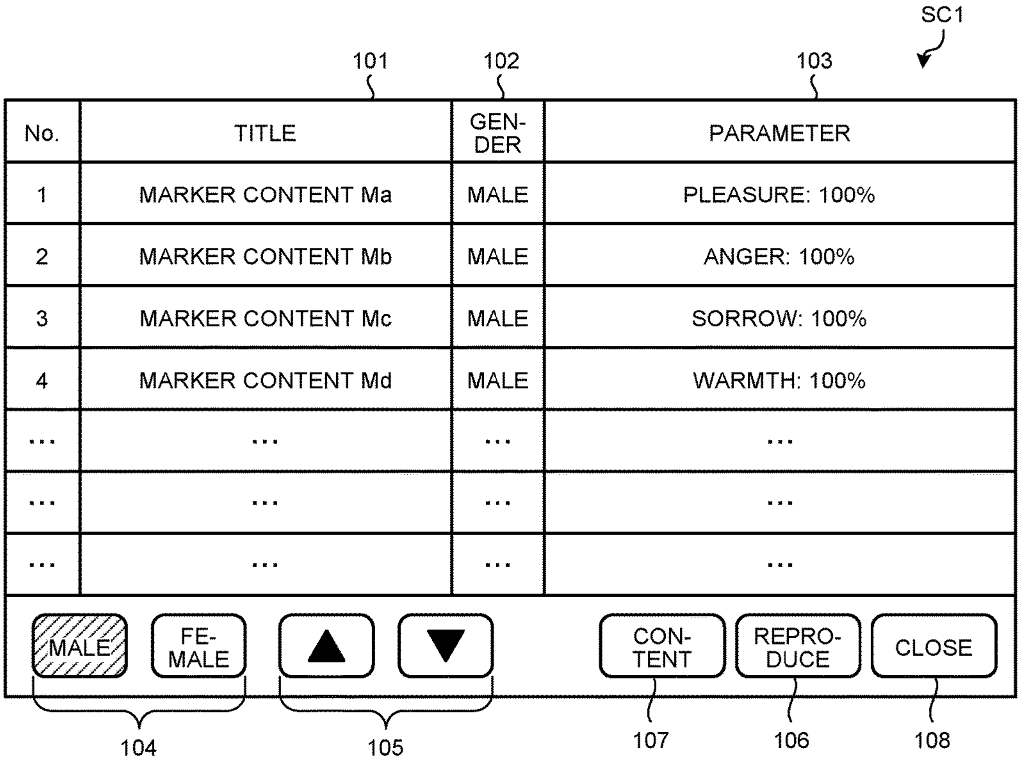
FIG. 8 is a schematic diagram illustrating an example of a marker content list screen.

FIG. 8 is a schematic diagram illustrating an example of the marker content list screen SC1. The marker content list screen SC1 is the UI screen that presents a list of marker content preliminarily registered in the content storage unit 40 to the user. As illustrated in FIG. 8, the marker content list screen SC1 is provided with a "title" column 101, a "gender" column 102, a "parameter" column 103, a gender switching button 104, an up-down button 105, a "reproduce" button 106, a "content" button 107, and a "close" button 108.

The "title" column 101 displays the name of each piece of marker content. The "gender" column 102 displays the gender attribute value (male or female) of each piece of marker content. The "parameter" column 103 displays the attribute such as emotion or prosody and the attribute value (parameter) of each piece of marker content. In the marker content list screen SC1 illustrated in FIG. 8, the list of marker content is presented for each of the genders of male and female. The gender of marker content to be presented is switched by operating the gender switching button 104. FIG. 8 illustrates the presentation of the list of marker content in relation to the gender of male.

The up-down button 105 is used for designating any marker content from the list of marker content by moving a cursor (not illustrated) upward and downward.

The "reproduce" button 106 is used for reproducing the voice waveform of the synthesized voice included in the designated marker content to output the reproduced voice waveform as the voice. When the "reproduce" button 106 is operated in a state where any marker content is designated from the presented list of marker content, the synthesized voice of the designated marker content is output from the speaker of the user terminal 2. The user can perform trail listening on the synthesized voice of desired marker content using the "reproduce" button 106.

The "content" button 107 is used for selecting desired marker content from the list of marker content. When the "content" button 107 is operated in a state where any marker content is designated from the presented list of marker content, the UI screen displayed on the user terminal 2 changes from the marker content list screen SC1 to the relevant content list screen SC2, in which a list of relevant content associated with the designated marker content is presented.

The "close" button 108 is used for closing the marker content list screen SC1. When the "close" button 108 is operated, the display of the UI screen on the user terminal 2 ends.

Figure 9:
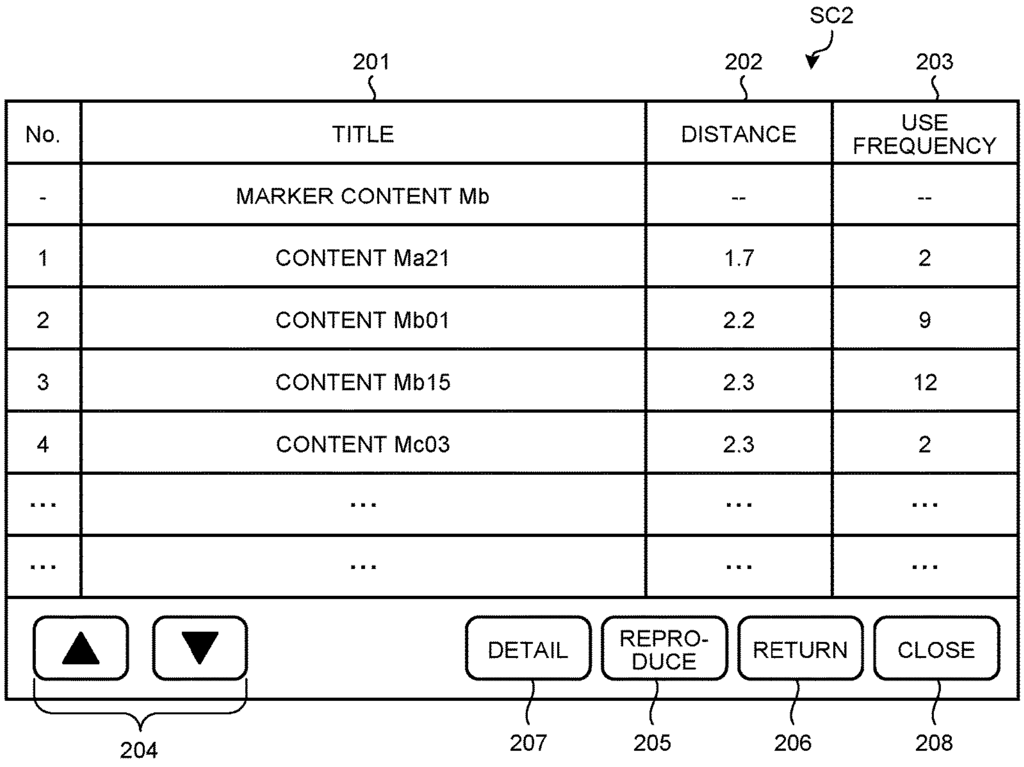
FIG. 9 is a schematic diagram illustrating an example of a relevant content list screen.

FIG. 9 is a schematic diagram illustrating an example of the relevant content list screen SC2. The relevant content list screen SC2 is the UI screen that presents a list of relevant content registered in the content storage unit 40 in association with the marker content selected by the user using the marker content list screen SC1 to the user. As illustrated in FIG. 9, the relevant content list screen SC2 is provided with a "title" column 201, a "distance" column 202, a "use frequency" column 203, an up-down button 204, a "reproduce" button 205, a "return" button 206, a "detail" button 207, and a "close" button 208.

The "title" column 201 displays the name of the marker content selected in the marker content list screen SC1 and the name of each piece of relevant content. The "distance" column 202 displays the inter-content distance D (ci,cj) between the marker content and the relevant content for each relevant content. The "use frequency" column 203 displays the use frequency of the marker content and the use frequency of the relevant content for each piece of relevant content. As illustrated in FIG. 9, in the relevant content list screen SC2, a plurality of pieces of relevant content associated with the marker content are displayed in a list in ascending order of the values of the inter-content distances D (ci,cj), i.e., in such manner that with an increase in similarity of the relevant content with the marker content, the relevant content is displayed at the upper position in the list. The pieces of relevant content having the same value of the inter-content distance D (ci,cj) are displayed in the list in descending order of the values of the use frequencies of the pieces of relevant content. The order of relevant content in the list is not limited to the example illustrated in FIG. 9. For example, a plurality of pieces of relevant content may be displayed in a list in descending order of the values of the use frequencies of the respective pieces of relevant content.

The up-down button 204 is used for designating any relevant content from the list of relevant content by moving a cursor (not illustrated) upward and downward.

The "reproduce" button 205 is used for reproducing the voice waveform of the synthesized voice included in the designated relevant content to output the reproduced voice waveform as the voice. When the "reproduce" button 205 is operated in a state where any relevant content is designated from the presented list of relevant content, the synthesized voice of the designated relevant content is output from the speaker of the user terminal 2. The user can perform trail listening on the synthesized voice of desired relevant content using the "reproduce" button 205.

The "return" button 206 is used for returning the UI screen displayed on the user terminal 2 from the relevant content list screen SC2 illustrated in FIG. 9 to the marker content list screen SC1 illustrated in FIG. 8.

The "detail" button 207 is used for checking the details of desired relevant content. When the "detail" button 207 is operated in a state where any relevant content is designated from the presented list of relevant content, the UI screen displayed on the user terminal 2 changes from the relevant content list screen SC2 to the content detail screen SC3, in which detailed information about the designated relevant content is displayed.

The "close" button 208 is used for closing the relevant content list screen SC2. When the "close" button 208 is operated, the display of the UI screen on the user terminal 2 ends.

Figure 10:
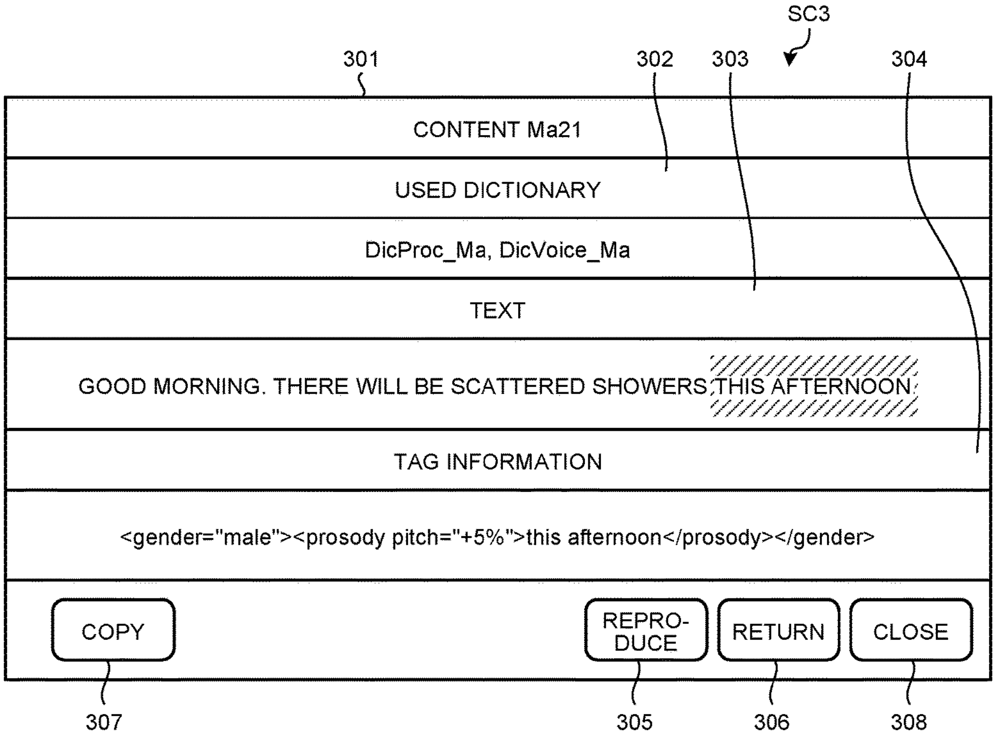
FIG. 10 is a schematic diagram illustrating an example of a content detail screen.

FIG. 10 is a schematic diagram illustrating an example of the content detail screen SC3. The content detail screen SC3 is the UI screen that presents the detailed information about the relevant content selected by the user using the relevant content list screen SC2 to the user. As illustrated in FIG. 10, the content detail screen SC3 is provided with a content name column 301, a "used dictionary" column 302, a "text" column 303, a "tag information" column 304, a "reproduce" button 305, a "return" button 306, a "copy" button 307, and a "close" button 308.

The content name column 301 displays the name of the content. The "used dictionary" column 302 displays the name of the voice synthesis dictionary 50 that was used in generating the voice waveform of the synthesized voice included in the content. The "text" column 303 displays text (the whole of the text) in the tagged text included in the content. The "tag information" column 304 displays the tagged text corresponding to the designated range in the text displayed in the "text" column 303. The user designates any range in the text displayed in the "text" column 303 and can check the tag information about the designated range in the "tag information" column 304.

The "reproduce" button 305 is used for reproducing the voice waveform of the synthesized voice corresponding to the tagged text displayed in the "tag information" column 304 to output the reproduced voice waveform as the voice. When the "reproduce" button 305 is operated in a state where the tagged text corresponding to the range designated by the user is displayed in the "tag information" column 304, the synthesized voice corresponding to the tagged text is output from the speaker of the user terminal 2. The user can perform trail listening on the synthesized voice of the desired range using the "reproduce" button 305.

The "return" button 306 is used for returning the UI screen displayed on the user terminal 2 from the content detail screen SC3 illustrated in FIG. 10 to the relevant content list screen SC2 illustrated in FIG. 9.

The "copy" button 307 is used for determining the content to be the selected content. When the "copy" button 307 is operated, the UI screen displayed on the user terminal 2 changes from the content detail screen SC3 to the content generation screen SC4.

The "close" button 308 is used for closing the content detail screen SC3. When the "close" button 308 is operated, the display of the UI screen on the user terminal 2 ends.

Figure 11:
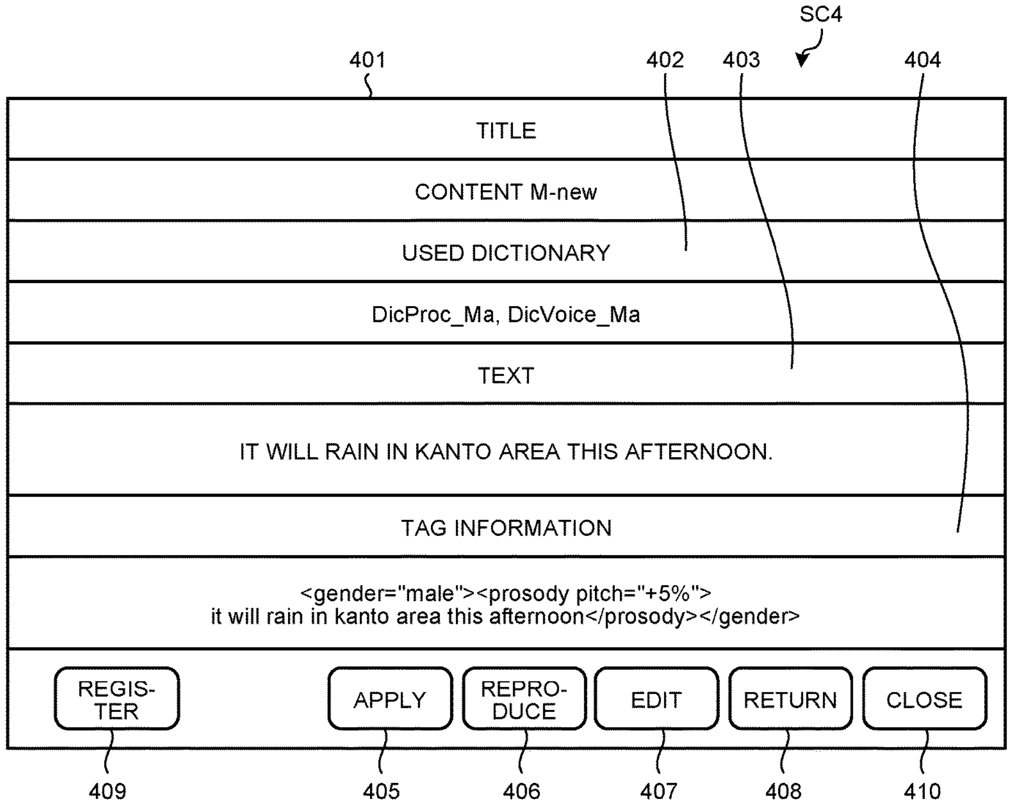
FIG. 11 is a schematic diagram illustrating an example of a content generation screen.

FIG. 11 is a schematic diagram illustrating an example of the content generation screen SC4. The content generation screen SC4 is the UI screen used for producing new content by applying the tag information in the selected content to text designated by the user. As illustrated in FIG. 11, the content generation screen SC4 is provided with a "title" column 401, a "used dictionary" column 402, a "text" column 403, a "tag information" column 404, an "apply" button 405, a "reproduce" button 406, an "edit" button 407, a "return" button 408, a "register" button 409, and a "close" button 410.

The "title" column 401 displays the name of new content to be generated using the content generation screen SC4. The user can set a desired name to the new content by writing any name into the "title" column 401. The "used dictionary" column 402 displays the name of the voice synthesis dictionary 50 that was used in generating the voice waveform of the synthesized voice included in the selected content. The user can change the name of the voice synthesis dictionary 50 used in generating the voice waveform of the synthesized voice included in the new content by changing the name of the voice synthesis dictionary 50 displayed in the "used dictionary" column 402. The "text" column 403 displays the text serving as the target of voice synthesis. The user can designate the text serving as the target of voice synthesis by writing any text into the "text" column 403. The "tag information" column 404 displays the tagged text generated by applying the tag information in the tagged text included in the selected content to the text displayed in the "text" column 403.

The "apply" button 405 is used for reproducing the voice waveform of the synthesized voice corresponding to the tagged text displayed in the "tag information" column 404. When the "apply" button 405 is operated in a state where the tagged text is displayed in the "tag information" column 404, the voice waveform of the synthesized voice is generated based on the tagged text displayed in the "tag information" column 404. In the production, the voice synthesis dictionary 50 displayed in the "used dictionary" column 402 is used.

The "reproduce" button 406 is used for reproducing the voice waveform of the synthesized voice generated based on the tagged text displayed in the "tag information" column 404 to output the reproduced voice waveform as the voice. When the "reproduce" button 406 is operated after the operation of the "apply" button 405, the synthesized voice generated as a result of the operation of the "apply" button 405 is output from the speaker of the user terminal 2. The user can perform trail listening on the synthesized voice of content to be newly generated using the "reproduce" button 406.

The "edit" button 407 is used for amending the tagged text displayed in the "tag information" column 404. When the "edit" button 407 is operated, the tagged text displayed in the "tag information" column 404 can be edited. The user can amend the tagged text of the content to be newly generated by operating the "edit" button 407 and performing amendment operation on the tagged text displayed in the "tag information" column 404. For example, the attribute value (in the example illustrated in FIG. 11, +5%) in the tag information is amended.

The "return" button 408 is used for returning the UI screen displayed on the user terminal 2 from the content generation screen SC4 illustrated in FIG. 11 to the content detail screen SC3 illustrated in FIG. 10.

The "register" button 409 is used for registering the generated new content in the content storage unit 40. When the "register" button 409 is operated, a combination of the tagged text displayed in the "tag information" column 404 and the voice waveform of the synthesized voice generated based on the tagged text is registered in the content storage unit 40 as new content.

The "close" button 410 is used for closing the content generation screen SC4. When the "close" button 410 is operated, the display of the UI screen on the user terminal 2 ends.

The following describes exemplary operation of the voice synthesizer 1 that generates content and registers the produced content while causing the user terminal 2 to display the UI screens exemplarily illustrated in FIGS. 7 to 11.

Figure 12:
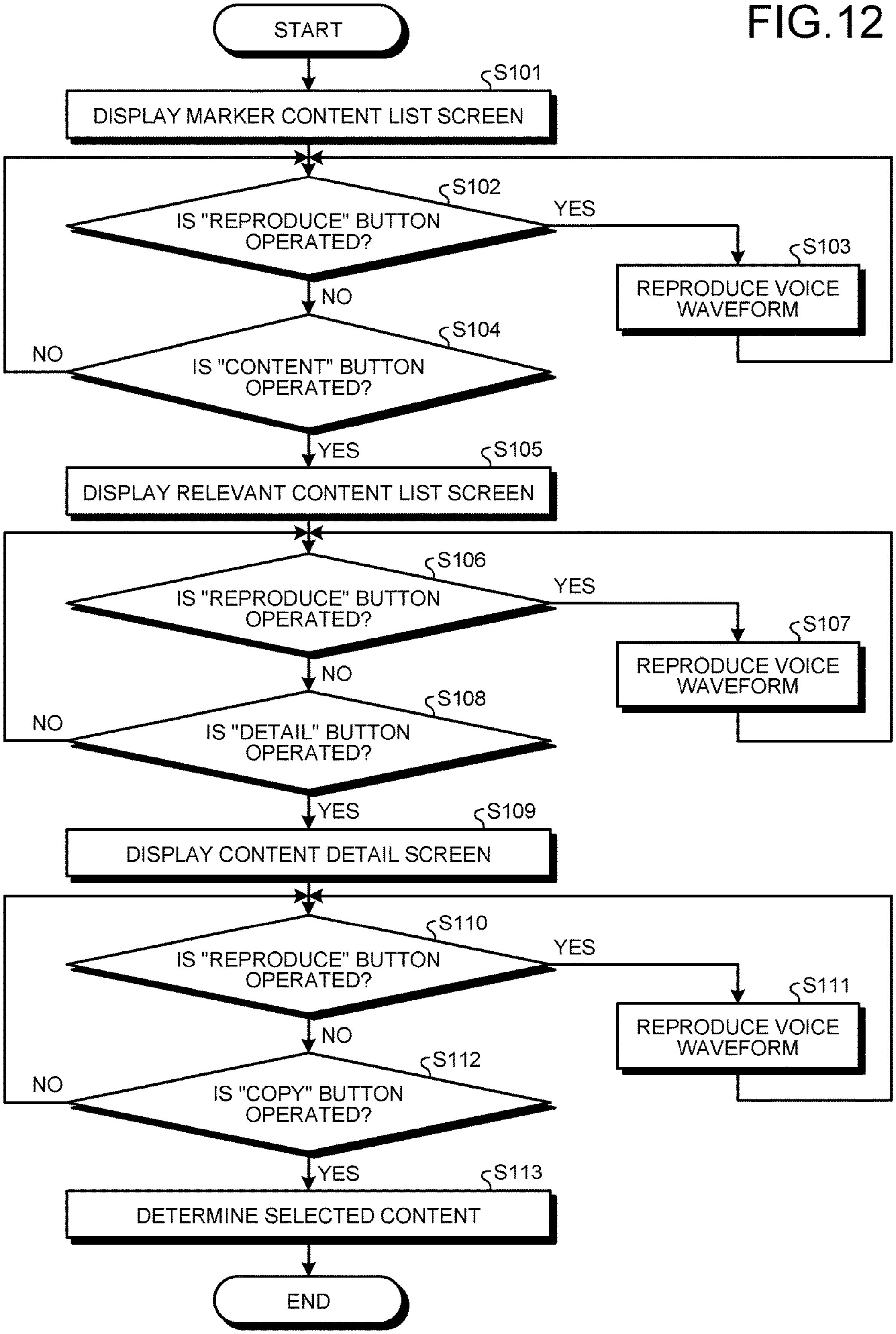
FIG. 12 is a flowchart illustrating an exemplary procedure of the processing performed by the content selection unit.

The processing performed by the content selection unit 10 is described with reference to FIG. 12. FIG. 12 is a flowchart illustrating an exemplary procedure of the processing performed by the content selection unit 10.

At the start of the processing illustrated in the flowchart in FIG. 12, the marker content presentation unit 11 causes the user terminal 2 to display the marker content list screen SC1 exemplarily illustrated in FIG. 8 (step S101). When the gender switching button 104 in the marker content list screen SC1 is operated after the user terminal 2 displays the marker content list screen SC1, the gender of marker content to be presented as a list is switched, the illustration of which is omitted in the flowchart in FIG. 12. When the "close" button 108 is operated at any timing, the processing ends.

It is determined whether the "reproduce" button 106 is operated in a state where any of the marker content in the list displayed on the marker content list screen SC1 is designated (step S102). If the "reproduce" button 106 is operated (Yes at step S102), the reproduction unit 14 reproduces the voice waveform of the synthesized voice included in the designated marker content, and causes the user terminal 2 to output the reproduced voice waveform as the voice from the speaker thereof (step S103), and then the processing returns to step S102.

If the "reproduce" button 106 is not operated (No at step S102), it is determined whether the "content" button 107 is operated in a state where any of the marker content displayed in the list is designated (step S104). If the "content" button 107 is not operated (No at step S104), the processing returns to step S102. If the "content" button 107 is operated (Yes at step S104), the relevant content presentation unit 12 causes the user terminal 2 to display the relevant content list screen SC2 exemplarily illustrated in FIG. 9 (step S105).

When the "return" button 206 is operated at any timing after the user terminal 2 displays the relevant content list screen SC2, the processing returns to step S101, at which the user terminal 2 displays the marker content list screen SC1 again, the illustration of which is omitted in the flowchart in FIG. 12. When the "close" button 208 is operated at any timing, the processing ends.

It is determined whether the "reproduce" button 205 is operated in a state where any of the relevant content in the list displayed on the relevant content list screen SC2 is designated (step S106). If the "reproduce" button 205 is operated (Yes at step S106), the reproduction unit 14 reproduces the voice waveform of the synthesized voice included in the designated relevant content, and causes the user terminal 2 to output the reproduced voice waveform as the voice from the speaker thereof (step S107), and then the processing returns to step S106.

If the "reproduce" button 205 is not operated (No at step S106), it is determined whether the "detail" button 207 is operated in a state where any of the relevant content displayed in the list is designated (step S108). If the "detail" button 207 is not operated (No at step S108), the processing returns to step S106. If the "detail" button 207 is operated (Yes at step S108), the selected content determination unit 13 causes the user terminal 2 to display the content detail screen SC3 exemplarily illustrated in FIG. 10 (step S109).

When the "return" button 306 is operated at any timing after the user terminal 2 displays the content detail screen SC3, the processing returns to step S105, at which the user terminal 2 displays the relevant content list screen SC2 again, the illustration of which is omitted in the flowchart in FIG. 12. When the "close" button 308 is operated at any timing, the processing ends.

It is determined whether the "reproduce" button 305 is operated in a state where the tagged text is displayed in the "tag information" column 304 in the content detail screen SC3 (step S110). If the "reproduce" button 305 is operated (Yes at step S110), the reproduction unit 14 reproduces the voice waveform of the synthesized voice corresponding to the tagged text displayed in the "tag information" column 304, and causes the user terminal 2 to output the reproduced voice waveform as the voice from the speaker thereof (step S111), and then the processing returns to step S110.

If the "reproduce" button 305 is not operated (No at step S110), it is determined whether the "copy" button 307 is operated in a state where the tagged text is displayed in the "tag information" column 304 (step S112). If the "copy" button 307 is not operated (No at step S112), the processing returns to step S110. If the "copy" button 307 is operated (Yes at step S112), the selected content determination unit 13 determines the content containing detail information displayed by the content detail screen SC3 to be the selected content (step S113). The processing is, then, passed to the content generation unit 20. The processing performed by the content selection unit 10, thus, ends.

Figure 13:
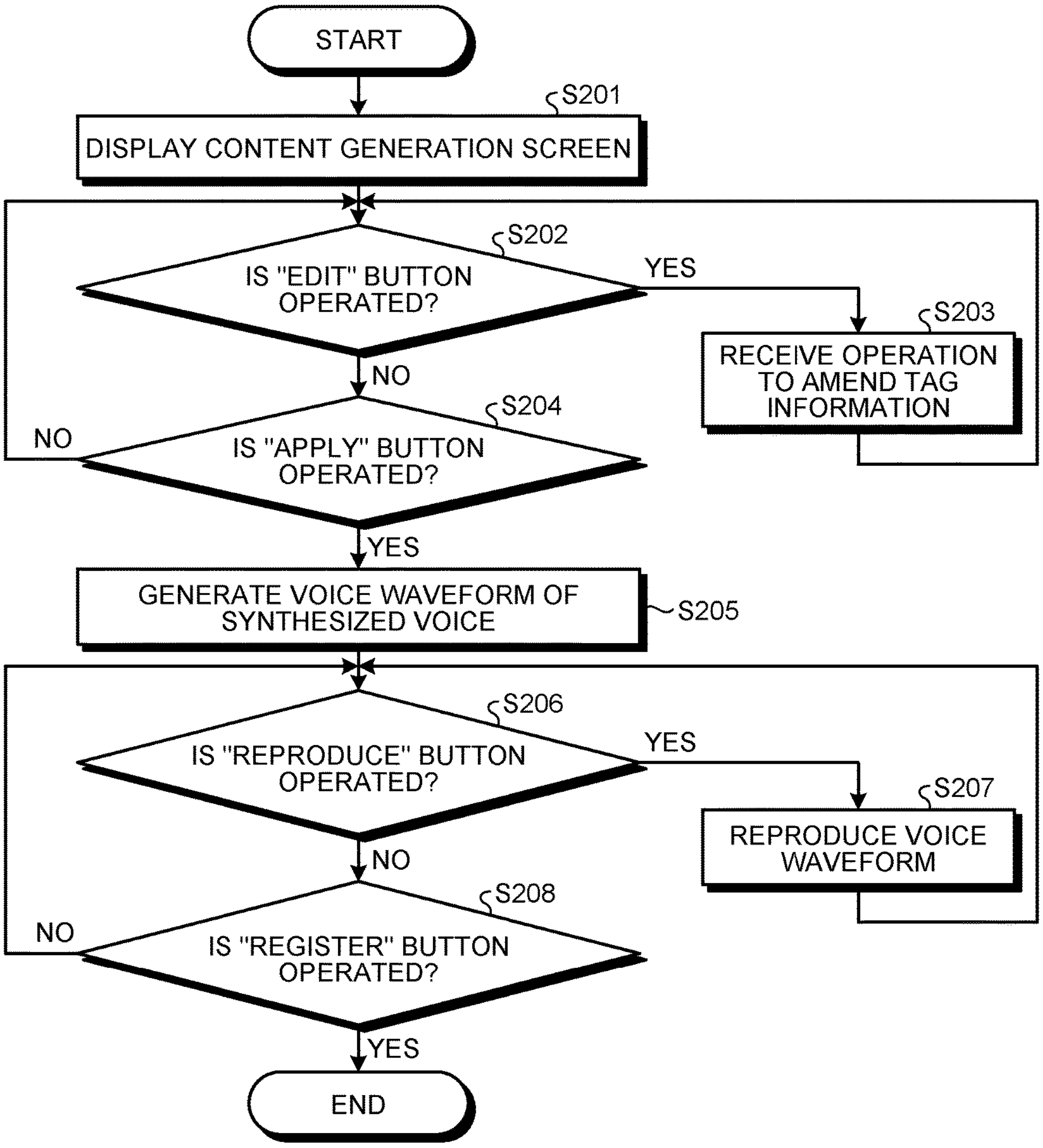
FIG. 13 is a flowchart illustrating an exemplary procedure of the processing performed by the content generation unit.

The following describes the processing performed by the content generation unit 20 with reference to FIG. 13. FIG. 13 is a flowchart illustrating an exemplary procedure of the processing performed by the content generation unit 20.

At the start of the processing illustrated in the flowchart in FIG. 13, the tag information extraction unit 21 causes the user terminal 2 to display the content generation screen SC4 exemplarily illustrated in FIG. 11 (step S201). The user writes the text serving as the target of voice synthesis into the "text" column 403 in the content generation screen SC4. At the time, the tag information extraction unit 21 extracts the tag information from the tagged text included in the selected content. The tagged text generation unit 22 applies the tag information extracted by the tag information extraction unit 21 to the text written in the "text" column 403 to generate the tagged text. The tagged text generated by the tagged text generation unit 22 is displayed in the "tag information" column 404 in the content generation screen SC4.

When the "return" button 408 is operated at any timing after the user terminal 2 displays the content generation screen SC4, the processing returns to step S109 in FIG. 12, at which the user terminal 2 displays the content detail screen SC3 again, the illustration of which is omitted in the flowchart in FIG. 13. When the "close" button 410 is operated at any timing, the processing ends.

It is determined whether the "edit" button 407 is operated in a state where the tagged text is displayed in the "tag information" column 404 (step S202). If the "edit" button 407 is operated (Yes at step S202), the tagged text amendment unit 23 receives the user's operation to amend the tagged text, and amends the tagged text displayed in the "tag information" column 404 (step S203), and then the processing returns to step S202.

If the "edit" button 407 is not operated (No at step S202), it is determined whether the "apply" button 405 is operated in a state where the tagged text is displayed in the "tag information" column 404 (step S204). If the "apply" button 405 is not operated (No at step S204), the processing returns to step S202. If the "apply" button 405 is operated (Yes at step S204), the voice waveform generation unit 24 generates the voice waveform of the synthesized voice using the voice synthesis dictionary 50 displayed in the "used dictionary" column 402 based on the tagged text displayed in the "tag information" column 404 (step S205).

It is determined whether the "reproduce" button 406 is operated (step S206). If the "reproduce" button 406 is operated (Yes at step S206), the reproduction unit 25 reproduces the voice waveform of the synthesized voice generated at step S205 and causes the user terminal 2 to output the reproduced voice waveform as the voice from the speaker thereof (step S207), and then the processing returns to step S206.

If the "reproduce" button 406 is not operated (No at step S206), it is determined whether the "register" button 409 is operated (step S208). If the "register" button 409 is not operated (No at step S208), the processing returns to step S206. If the "register" button 409 is operated (Yes at step S208), the processing is passed to the content registration unit 30. The processing performed by the content generation unit 20, thus, ends.

Figure 14:
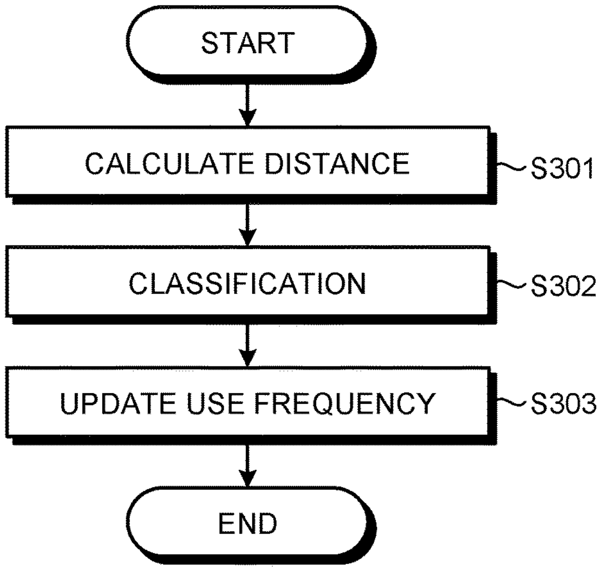
FIG. 14 is a flowchart illustrating an exemplary procedure of the processing performed by the content registration unit.

The following describes the processing performed by the content registration unit 30 with reference to FIG. 14. FIG. 14 is a flowchart illustrating an exemplary procedure of the processing performed by the content registration unit 30.

At the start of the processing illustrated in the flowchart in FIG. 14, the similarity calculation unit 31 calculates the inter-content distance D (ci,cj) between the new content generated by the content generation unit 20 and the marker content for each marker content registered in the content storage unit 40 (step S301).

The classification unit 32 classifies the new content generated by the content generation unit 20 based on the inter-content distance D (ci,cj) calculated at step S301 in such a manner that the classification unit 32 registers the new content in the content storage unit 40 in association with the marker content similar to the content (step S302). The new content registered in the content storage unit 40 serves as a candidate of the selected content used for generating other content in the future.

The use frequency updating unit 33 updates the use frequency of the content used as the selected content when the content generation unit 20 generates the new content (step S303). The processing performed by the content registration unit 30, thus, ends.

As described above in detail based on the specific examples, the voice synthesizer 1 in the embodiment determines the selected content used for generating new content out of the pieces of content registered in the content storage unit 40 in accordance with operation performed by the user while using the UI screen. The voice synthesizer 1 applies the tag information in the tagged text included in the selected content to the text designated by the user to generate new content. The voice synthesizer 1 registers the generated new content in the content storage unit 40 as a candidate of the selected content. The voice synthesizer 1 in the embodiment, thus, does not need to preliminarily prepare a number of templates for generating the tagged text and prepare training data and correct answer data for automatically generating the templates. The voice synthesizer 1 can generate the tagged text from any text using the content generated in the past, thereby making it possible to efficiently generate the tagged text.

The voice synthesizer 1 in the embodiment allows the user to generate the tagged text by selecting the tag information to be applied to the text or to amend the tagged text if necessary while performing trial listening on the synthesized voice of the content generated in the past or the synthesized voice generated by applying the desired tag information to the text. As a result, the voice synthesizer 1 can efficiently obtain the synthesized voice the user desires.

Second Embodiment

The following describes a second embodiment. A voice synthesizer in the second embodiment includes a content selection unit having a different structure from that in the voice synthesizer in the first embodiment. In the following, the voice synthesizer in the second embodiment is described as "a voice synthesizer 1'" and the content selection unit specific to the voice synthesizer 1' is described as a content selection unit 60, so that the voice synthesizer 1' and the content selection unit 60 are distinguished from those in the first embodiment. The structure other than the above is the same as that of the first embodiment. The duplicate descriptions are thus appropriately omitted. The following describes the content selection unit 60.

Figure 15:
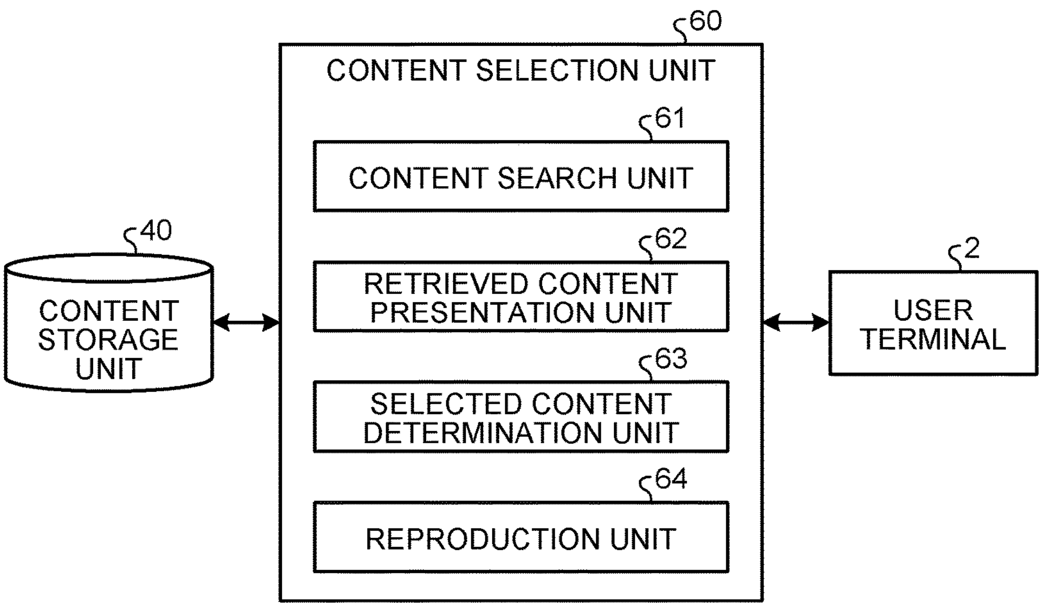
FIG. 15 is a block diagram illustrating an exemplary structure of a content selection unit in a second embodiment.

FIG. 15 is a block diagram illustrating an exemplary structure of the content selection unit 60. As illustrated in FIG. 15, the content selection unit 60 includes a content search unit 61, a retrieved content presentation unit 62, a selected content determination unit 63, and a reproduction unit 64.

The content search unit 61 retrieves the content including the tagged text matching an input keyword from among the pieces of content registered in the content storage unit 40. For example, the content search unit 61 causes the user terminal 2 to display a content search screen SC5 (refer to FIG. 17), which is described later, as the UI screen displayed on the user terminal 2, and retrieves the content including the tagged text matching a keyword input by the user using the content search screen SC5 from among the pieces of content registered in the content storage unit 40.

The retrieved content presentation unit 62 presents a list of retrieved content retrieved by the content search unit 61 to the user. The retrieved content presentation unit 62 causes the user terminal 2 to display a list of retrieved content retrieved by the content search unit 61 on the content search screen SC5 displayed as the UI screen, for example.

The selected content determination unit 63 determines the retrieved content selected from the list of retrieved content to be the selected content. The selected content determination unit 63 determines the retrieved content selected by the user from the list of retrieved content displayed on the content search screen SC5 to be the selected content, for example.

The reproduction unit 64 reproduces the voice waveform of the synthesized voice included in the retrieved content, and causes the user terminal 2 to output the reproduced voice waveform as the voice from the speaker thereof, for example. The reproduction unit 64 reproduces the voice waveform of the synthesized voice included in the retrieved content designated by the user from the list of retrieved content displayed on the content search screen SC5, and causes the user terminal 2 to output the reproduced voice waveform as the voice from the speaker thereof, for example.

Figure 16:
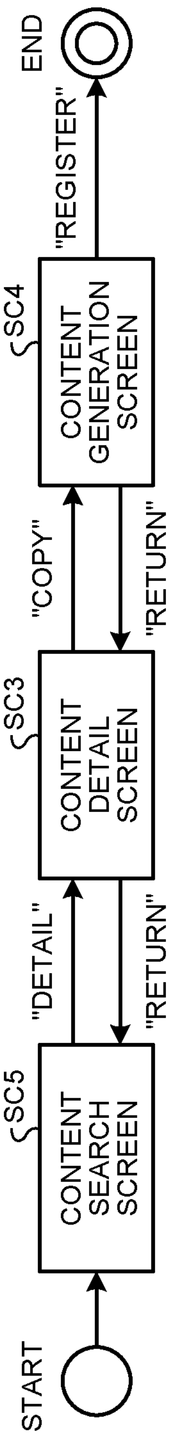
FIG. 16 is a schematic diagram to explain transition of screens in the UI screen displayed on the user terminal.

FIG. 16 is a schematic diagram to explain transition of screens in the UI screen that the voice synthesizer 1' in the second embodiment causes the user terminal 2 to display. The voice synthesizer 1' in the embodiment causes the user terminal 2 to sequentially display, as the UI screen, the content search screen SC5, the content detail screen SC3, and the content generation screen SC4 in accordance with the screen transition illustrated in FIG. 16, for example.

Figure 17:
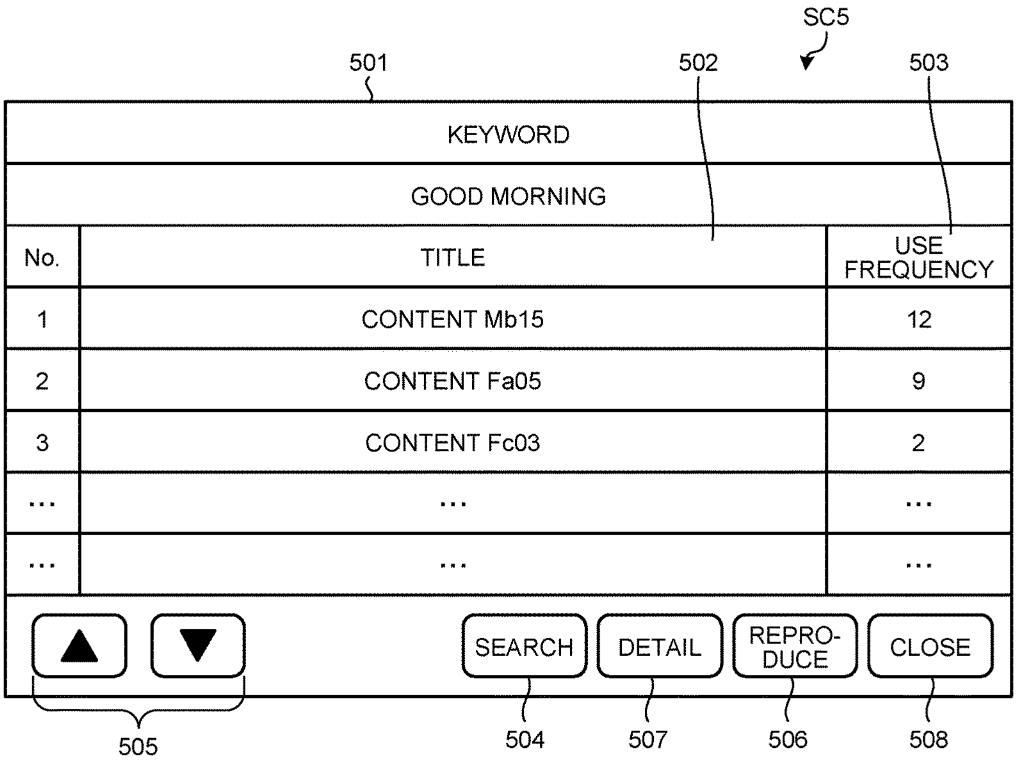
FIG. 17 is a schematic diagram illustrating an example of a content search screen.

FIG. 17 is a schematic diagram illustrating an example of the content search screen SC5. The content search screen SC5 is the UI screen that receives input of a keyword for retrieving the content and presents the list of retrieved content serving as the result of the search to the user. As illustrated in FIG. 17, the content search screen SC5 is provided with a "keyword" input column 501, a "title" column 502, a "use frequency" column 503, a "search" button 504, an up-down button 505, a "reproduce" button 506, a "detail" button 507, and a "close" button 508.

The "keyword" input column 501 serves as an area in which a keyword used for the search is input. The user can input any text such as text serving as the target of voice synthesis in the "keyword" input column 501 as a keyword. The "title" column 502 displays the name of each piece of retrieved content serving as the result of the search. The "use frequency" column 503 displays the use frequency of each piece of retrieved content serving as the result of the search.

The "search" button 504 is used for the search using the keyword input in the "keyword" input column 501. When the "search" button 504 is operated in a state where the keyword is input in the "keyword" input column 501, the retrieved content including the tagged text matching the keyword is retrieved from the content storage unit 40, and the name of the retrieved content is displayed in the "title" column 502 while the use frequency of the retrieved content is displayed in the "use frequency" column 503.

The up-down button 505 is used for designating any retrieved content from the list of retrieved content by moving a cursor (not illustrated) upward and downward.

The "reproduce" button 506 is used for reproducing the voice waveform of the synthesized voice included in the designated retrieved content to output the reproduced voice waveform as the voice. When the "reproduce" button 506 is operated in a state where any retrieved content is designated from the presented list of retrieved content, the synthesized voice of the designated retrieved content is output from the speaker of the user terminal 2. The user can perform trail listening on the synthesized voice of desired retrieved content using the "reproduce" button 506.

The "detail" button 507 is used for checking the details of desired retrieved content. When the "detail" button 507 is operated in a state where any retrieved content is designated from the presented list of retrieved content, the UI screen displayed on the user terminal 2 changes from the content search screen SC5 to the content detail screen SC3 (refer to FIG. 10), in which detailed information about the designated retrieved content is displayed.

The "close" button 508 is used for closing the content search screen SC5. When the "close" button 508 is operated, the display of the UI screen on the user terminal 2 ends.

Figure 18:
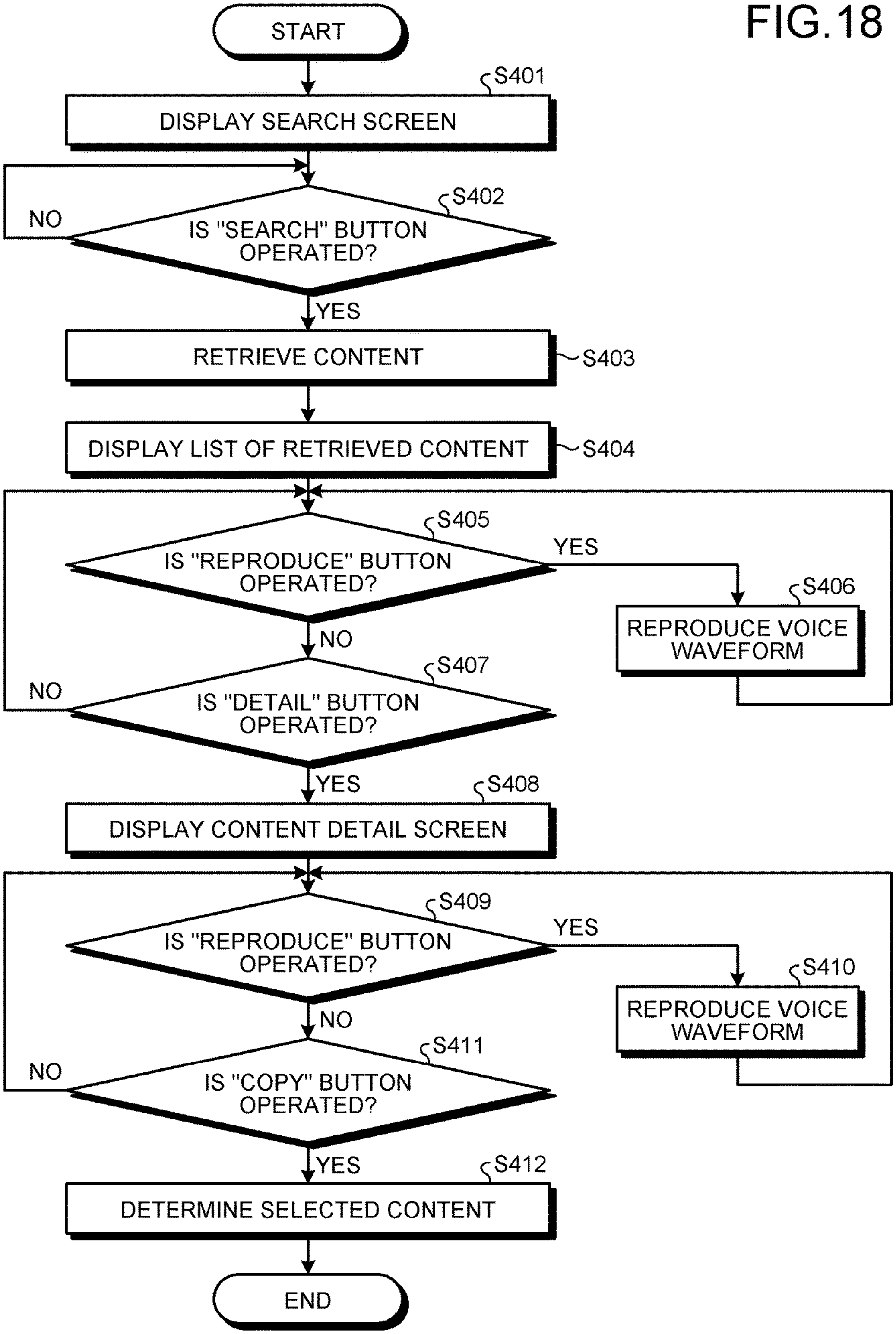
FIG. 18 is a flowchart illustrating an exemplary procedure of the processing performed by the content selection unit in the second embodiment.

The following describes the processing performed by the content selection unit 60 that determines the selected content while causing the user terminal 2 to display the content search screen SC5 exemplarily illustrated in FIG. 17 and the content detail screen SC3 exemplarily illustrated in FIG. 10 with reference to FIG. 18. FIG. 18 is a flowchart illustrating an exemplary procedure of the processing performed by the content selection unit 60.

At the start of the processing illustrated in the flowchart in FIG. 18, the content search unit 61 causes the user terminal 2 to display the content search screen SC5 exemplarily illustrated in FIG. 17 (step S401). When the "close" button 508 is operated at any timing after the user terminal 2 displays the content search screen SC5, the processing ends, the illustration of which is omitted in the flowchart in FIG. 18.

It is determined whether the "search" button 504 is operated in a state where the keyword is input in the "keyword" input column 501 in the content search screen SC5 (step S402). If the "search" button 504 is not operated (No at step S402), the processing returns to step S402, at which the determination is repeated. If the "search" button 504 is operated (Yes at step S402), the content search unit 61 retrieves the retrieved content including the tagged text matching the keyword input in the "keyword" input column 501 from among the pieces of content registered in the content storage unit 40 (step S403). The content search unit 61 causes the list of searched content obtained as the search result to be displayed on the content search screen SC5 (step S404).

It is determined whether the "reproduce" button 506 is operated in a state where any piece of the retrieved content in the list displayed on the content search screen SC5 is designated (step S405). If the "reproduce" button 506 is operated (Yes at step S405), the reproduction unit 64 reproduces the voice waveform of the synthesized voice included in the designated retrieved content, and causes the user terminal 2 to output the reproduced voice waveform as the voice from the speaker thereof (step S406), and then the processing returns to step S405.

If the "reproduce" button 506 is not operated (No at step S405), it is determined whether the "detail" button 507 is operated in a state where any piece of the retrieved content displayed in the list is designated (step S407). If the "detail" button 507 is not operated (No at step S407), the processing returns to step S405. If the "detail" button 507 is operated (Yes at step S407), the selected content determination unit 63 causes the user terminal 2 to display the content detail screen SC3 exemplarily illustrated in FIG. 10 (step S408).

When the "return" button 306 is operated at any timing after the user terminal 2 displays the content detail screen SC3, the processing returns to step S401, at which the user terminal 2 displays the content search screen SC5 again, the illustration of which is omitted in the flowchart in FIG. 18. When the "close" button 308 is operated at any timing, the processing ends It is determined whether the "reproduce" button 305 is operated in a state where the tagged text is displayed in the "tag information" column 304 in the content detail screen SC3 (step S409). If the "reproduce" button 305 is operated (Yes at step S409), the reproduction unit 64 reproduces the voice waveform of the synthesized voice corresponding to the tagged text displayed in the "tag information" column 304, and causes the user terminal 2 to output the reproduced voice waveform as the voice from the speaker thereof (step S410), and then the processing returns to step S409.

If the "reproduce" button 305 is not operated (No at step S409), it is determined whether the "copy" button 307 is operated in a state where the tagged text is displayed in the "tag information" column 304 (step S411). If the "copy" button 307 is not operated (No at step S411), the processing returns to step S409. If the "copy" button 307 is operated (Yes at step S411), the selected content determination unit 63 determines the retrieved content containing detail information displayed by the content detail screen SC3 to be the selected content (step S412). The processing is, then, passed to the content generation unit 20. The processing performed by the content selection unit 60, thus, ends.

As described above, the voice synthesizer 1' in the embodiment retrieves the content including the tagged text matching the keyword from among the pieces of content registered in the content storage unit 40 in accordance with operation performed by the user using the UI screen. The voice synthesizer 1' determines the selected content used for generating new content from among the retrieved content. The voice synthesizer 1' applies the tag information in the tagged text included in the determined selected content to the text designated by the user to generate new content. The voice synthesizer 1' registers the generated new content in the content storage unit 40 as a candidate of the selected content. The voice synthesizer 1' in the embodiment can generate the tagged text from any text using content generated in the past in the same manner as the voice synthesizer 1 in the first embodiment. The voice synthesizer 1' can, thus, efficiently generate the tagged text. Furthermore, the voice synthesizer 1' in the embodiment can narrow down the candidates of the selected content using the keyword, thereby making it possible to more efficiently generate the tagged text.

Supplementary Explanation

The respective functional components in the voice synthesizer 1 in the first embodiment can be achieved by a program (software) executed using a general purpose computer system as basic hardware, for example.

Figure 19:
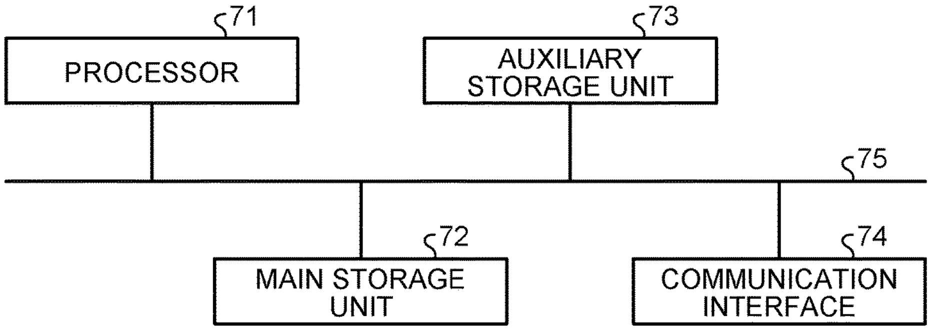
FIG. 19 is a block diagram schematically illustrating an exemplary hardware structure of the voice synthesizer.

FIG. 19 is a block diagram schematically illustrating an exemplary hardware structure of the major part of the voice synthesizer 1. As illustrated in FIG. 19, the major part of the voice synthesizer 1 is structured as a general purpose computer system that includes a processor 71 such as a CPU, a main storage unit 72 such as a random access memory (RAM), an auxiliary storage unit 73 using various storage devices, a communication interface 74, and a bus 75 that connects each one to another. The auxiliary storage unit 73 may be connected to the respective units with a local area network (LAN) in a wired or wireless manner, for example.

The respective functional components of the voice synthesizer 1 are achieved by the processor 71 executing a program stored in the auxiliary storage unit 73 using the main storage unit 72, for example. The program is recorded and provided as a computer program product on a computer-readable recording medium such as a compact disc read only memory (CD-ROM), a flexible disk (FD), a compact disc recordable (CD-R), and a digital versatile disc (DVD), as an installable or executable file, for example.

The program may be stored in another computer connected to a network such as the Internet and provided by being downloaded via the network. The program may be provided or distributed via a network such as the Internet. The program may be embedded and provided in a ROM (the auxiliary storage unit 73) in the computer.

The program has a module structure including the functional components (the content selection unit 10, the content generation unit 20, and the content registration unit 30) of the voice synthesizer 1. In actual hardware, the processor 71 reads the program from the recording medium and executes the program. Once the program is executed, the respective components are loaded into the main storage unit 72, so that the respective components are formed in the main storage unit 72. Part of or the whole of the respective components of the voice synthesizer 1 can be achieved using dedicated hardware such as an application specific integrated circuit (ASIC) and a field-programmable gate array (FPGA).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A voice synthesizer, comprising:

processing circuitry configure to function as:

a content selection unit configured to determine selected content among a plurality of pieces of content registered in a content storage unit, the content including tagged text in which tag information for controlling voice synthesis is added to text serving as a target of the voice synthesis, the content including a voice waveform of a synthesized voice corresponding to the tagged text, the voice waveform of the synthesized voice being reproduced in accordance with a user's operation;

a content generation unit configured to apply the tag information in the tagged text included in the selected content to designated text to generate new content; and a content registration unit configured to register the generated new content in the content storage unit, wherein the content registration unit registers, in the content storage unit, the generated new content in association with marker content in accordance with a similarity with the marker content, the marker content being the content serving as a marker and preliminarily registered in the content storage unit, and the content selection unit includes:

a marker content presentation unit configured to present a list of marker content:

a relevant content presentation unit configured to present a list of relevant content, the relevant content being the content associated with the marker content selected from the list of the marker content; and a selected content determination unit configured to determine the relevant content selected from the list of the relevant content to be the selected content.

2. The synthesizer according to claim 1, wherein the content generation unit includes:

a tag information extraction unit configured to extract the tag information from the tagged text included in the selected content;

a tagged text generation unit configured to apply the tag information extracted by the tag information extraction unit to designated text to generate the tagged text; and a voice waveform generation unit configured to generate a voice waveform of a synthesized voice corresponding to the tagged text generated by the tagged text generation unit using a voice synthesis dictionary, and the content registration unit registers, in the content storage unit, the generated new content that includes the tagged text generated by the tagged text generation unit and the voice waveform generated by the voice waveform generation unit.

3. The synthesizer according to claim 2, wherein the content generation unit further includes a first reproduction unit configured to reproduce the voice waveform of the synthesized voice generated by the voice waveform generation unit.

4. The synthesizer according to claim 2, wherein the content generation unit further includes a tagged text amendment unit configured to amend the tagged text generated by the tagged text generation unit based on a user's operation, and when the tagged text amendment unit amends the tagged text, the voice waveform generation unit generates a voice waveform of a synthesized voice corresponding to the amended tagged text.

5. The synthesizer according to claim 1, wherein the relevant content presentation unit presents the list of the relevant content in such a manner that a plurality of pieces of the relevant content are listed in an order in accordance with similarities with the marker content.

6. The synthesizer according to claim 1, wherein the relevant content presentation unit presents the list of the relevant content in such a manner that a plurality of pieces of the relevant content are listed in an order in accordance with the number of times the pieces of the relevant content are determined to be the selected content in past.

7. The synthesizer according to claim 1, wherein the content selection unit further includes a second reproduction unit configured to reproduce a voice waveform of a synthesized voice included in the marker content or a voice waveform of a synthesized voice included in the relevant content.

8. The synthesizer according to claim 1, wherein the content selection unit further includes:

a content search unit configured to retrieve the content including the tagged text matching an input keyword from among a plurality of pieces of the content registered in the content storage unit; and a retrieved content presentation unit configured to present a list of retrieved content that is the content retrieved by the content retrieval unit, wherein when retrieve content is selected from the list of the retrieved content, the selected content determination unit determines the retrieved content selected from the list of the retrieved content to be the selected content.

9. The synthesizer according to claim 8, wherein the content selection unit further includes a third reproduction unit configured to reproduce a voice waveform of a synthesized voice included in the retrieved content.

10. A voice synthesis method executed by a computer, the method comprising:

determining selected content among a plurality of pieces of content registered in a content storage unit, the content including tagged text in which tag information for controlling voice synthesis is added to text serving as a target of the voice synthesis, the content including a voice waveform of a synthesized voice corresponding to the tagged text, the voice waveform of the synthesized voice being reproduced in accordance with a user's operation;

applying the tag information in the tagged text included in the selected content to designated text to generate new content; and registering the generated new content in the content storage unit, wherein the registering registers, in the content storage unit, the generated new content in association with marker content in accordance with a similarity with the marker content, the marker content being the content serving as a marker and preliminarily registered in the content storage unit, and the determining includes:

presenting a list of the marker content;

presenting a list of relevant content, the relevant content being the content associated with the marker content selected from the list of the marker content; and determining the relevant content selected from the list of the relevant content to be the selected content.

11. A computer program product comprising a non-transitory computer-readable medium including programmed instructions that cause a computer to execute:

determining selected content among a plurality of pieces of content registered in a content storage unit, the content including tagged text in which tag information for controlling voice synthesis is added to text serving as a target of the voice synthesis, the content including a voice waveform of a synthesized voice corresponding to the tagged text, the voice waveform of the synthesized voice being reproduced in accordance with a user's operation;

applying the tag information in the tagged text included in the selected content to designated text to generate new content; and registering the generated new content in the content storage unit, wherein the registering registers, in the content storage unit, the generated new content in association with marker content in accordance with a similarity with the marker content, the marker content being the content serving as a marker and preliminarily registered in the content storage unit, and the determining includes:

presenting a list of the marker content;

presenting a list of relevant content, the relevant content being the content associated with the marker content selected from the list of the marker content; and determining the relevant content selected from the list of the relevant content to be the selected content.

* * * * *